US007656320B2

(12) United States Patent
Schneider

(10) Patent No.: US 7,656,320 B2
(45) Date of Patent: Feb. 2, 2010

(54) DIFFERENCE CODING ADAPTIVE CONTEXT MODEL USING COUNTING

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 9 days.

(21) Appl. No.: 12/100,847

(22) Filed: Apr. 10, 2008

(65) Prior Publication Data

US 2009/0256729 A1  Oct. 15, 2009

(51) Int. Cl.
*H03M 5/22* (2006.01)
(52) U.S. Cl. .......................................... 341/54; 341/107
(58) Field of Classification Search .................... 341/50, 341/54, 65.67, 107; 375/345; 714/755, 704
See application file for complete search history.

(56) References Cited

U.S. PATENT DOCUMENTS 5,886,655 A * 3/1999 Rust ........................... 341/107
7,408,487 B2 * 8/2008 Cho ........................... 341/107

* cited by examiner

*Primary Examiner*—Brian Young
(74) *Attorney, Agent, or Firm*—Blakely, Sokoloff, Taylor & Zafman LLP

(57) ABSTRACT

Techniques for improving encoding and decoding data are described herein. According to one embodiment, it is determined whether a current context can encode a retrieved symbol. The current context includes a plurality entries, each representing an encoded symbol, including a count value representing a frequency of the entry being used. A code is generated to a code stream, where the code represents a difference between an index of an entry in the current context associated with the retrieved symbol and a previous index used for encoding a previous symbol, if the current context can encode the retrieved symbol. A count value corresponding to the entry associated with the retrieved symbol is incremented in the current context. The current context is sorted based on count values of all entries in the current context, where the code stream and the literal stream are to be compressed and encoded by a compressor.

22 Claims, 20 Drawing Sheets

```
struct Context_Structure
{
    void  *Parent_Pointer;
    void  *Child_Pointer[256];
    int   Count_Value[257];
}
```

FIG. 3

| Symbol | Count |
|---|---|
| \<Esc\> | 0 |

Input Stream a b r a c a d a b r a a b r a c

Code Stream

Literal Stream

FIG. 6A

| Symbol | Count |
|---|---|
| \<Esc\> | 1 |
| a | 0 |

Input Stream a b r a c a d a b r a a b r a c

Code Stream

Literal Stream a

FIG. 6B

| Symbol | Count |
|---|---|
| \<Esc\> | 2 |
| a | 0 |
| b | 0 |

Input Stream a b r a c a d a b r a a b r a c

Code Stream 0

Literal Stream a b

FIG. 6C

| Symbol | Count |
|---|---|
| <Esc> | 3 |
| a | 0 |
| b | 0 |
| r | 0 |

Input Stream: a b r a c a d a b r a a b r a c

Code Stream: 0 0

Literal Stream: a b r

FIG. 6D

| Symbol | Count |
|---|---|
| <Esc> | 3 |
| a | 1 |
| b | 0 |
| r | 0 |

Input Stream: a b r a c a d a b r a a b r a c

Code Stream: 0 0 1

Literal Stream: a b r

FIG. 6E

| Symbol | Count |
|---|---|
| <Esc> | 4 |
| a | 1 |
| b | 0 |
| r | 0 |
| c | 0 |

Input Stream: a b r a c a d a b r a a b r a c

Code Stream: 0 0 1 1

Literal Stream: a b r c

FIG. 6F

| Symbol | Count |
|--------|-------|
| <Esc>  | 4     |
| a      | 2     |
| b      | 0     |
| r      | 0     |
| c      | 0     |

Input Stream: a b r a c a d a b r a a b r a c
Code Stream: 0 0 1 1 1
Literal Stream: a b r c

FIG. 6G

| Symbol | Count |
|--------|-------|
| <Esc>  | 5     |
| a      | 2     |
| b      | 0     |
| r      | 0     |
| c      | 0     |
| d      | 0     |

Input Stream: a b r a c a d a b r a a b r a c
Code Stream: 0 0 1 1 1 1
Literal Stream: a b r c d

FIG. 6H

| Symbol | Count |
|--------|-------|
| <Esc>  | 5     |
| a      | 3     |
| b      | 0     |
| r      | 0     |
| c      | 0     |
| d      | 0     |

Input Stream: a b r a c a d a a b r a a b r a c
Code Stream: 0 0 1 1 1 1 1
Literal Stream: a b r c d

| Symbol | Count |
|--------|-------|
| <Esc>  | 5     |
| a      | 3     |
| b      | 1     |
| r      | 0     |
| c      | 0     |
| d      | 0     |

Input Stream: a b r a c a d a b r a a b r a c

Code Stream: 0 0 1 1 1 1 3

Literal Stream: a b r c d

FIG. 6K

| Symbol | Count |
|--------|-------|
| <Esc>  | 5     |
| a      | 3     |
| b      | 1     |
| r      | 1     |
| c      | 0     |
| d      | 0     |

Input Stream: a b r a c a d a b r a a b r a c

Code Stream: 0 0 1 1 1 1 3 1

Literal Stream: a b r c d

FIG. 6L

| Symbol | Count |
|--------|-------|
| <Esc>  | 5     |
| a      | 4     |
| b      | 1     |
| r      | 1     |
| c      | 0     |
| d      | 0     |

Input Stream: a b r a c a d a b r a a b r a c

Code Stream: 0 0 1 1 1 1 3 1 2

Literal Stream: a b r c d

| Symbol | Count |
|---|---|
| a | 6 |
| <Esc> | 5 |
| b | 2 |
| r | 2 |
| c | 0 |
| d | 0 |

Input Stream: | a | b | r | a | c | a | d | a | b | r | a | a | b | r | a | c |

Code Stream: | 0 | 0 | 1 | 1 | 1 | 1 | 3 | 1 | 1 | 2 | 0 | 3 | 1 | 2 |

Literal Stream: | a | b | r | c | d |

FIG. 6P

| Symbol | Count |
|---|---|
| a | 6 |
| <Esc> | 5 |
| b | 2 |
| r | 2 |
| c | 1 |
| d | 0 |

Input Stream: | a | b | r | a | c | a | d | a | b | r | a | a | b | r | a | c |

Code Stream: | 0 | 0 | 1 | 1 | 1 | 1 | 3 | 1 | 2 | 0 | 3 | 1 | 2 | 5 |

Literal Stream: | a | b | r | c | d |

Output Stream: a b r

Code Stream: 1 1 1 3 1 2 0 3 1 2 5

Literal Stream: c d

| Symbol | Count |
|---|---|
| <Esc> | 3 |
| a | 0 |
| b | 0 |
| r | 0 |

FIG. 7E

Output Stream: a b r a

Code Stream: 1 1 1 3 1 2 0 3 1 2 5

Literal Stream: c d

| Symbol | Count |
|---|---|
| <Esc> | 3 |
| a | 1 |
| b | 0 |
| r | 0 |

FIG. 7F

Output Stream: a b r a c

Code Stream: 1 1 3 1 2 0 3 1 2 5

Literal Stream: d

| Symbol | Count |
|---|---|
| <Esc> | 4 |
| a | 1 |
| b | 0 |
| r | 0 |
| c | 0 |

FIG. 7G

| Symbol | Count |
|--------|-------|
| <Esc>  | 4     |
| a      | 2     |
| b      | 0     |
| r      | 0     |
| c      | 0     |

Output Stream: a b r a c a

Code Stream: 1 3 1 2 0 3 1 2 5

Literal Stream: d

FIG. 7H

| Symbol | Count |
|--------|-------|
| <Esc>  | 5     |
| a      | 2     |
| b      | 0     |
| r      | 0     |
| c      | 0     |
| d      | 0     |

Output Stream: a b r a c a d

Code Stream: 1 3 1 2 0 3 1 2 5

Literal Stream:

FIG. 7I

| Symbol | Count |
|--------|-------|
| <Esc>  | 5     |
| a      | 3     |
| b      | 0     |
| r      | 0     |
| c      | 0     |
| d      | 0     |

Output Stream: a b r a c a d a

Code Stream: 3 1 2 0 3 1 2 5

Literal Stream:

FIG. 7J

| Symbol | Count |
|---|---|
| <Esc> | 5 |
| a | 3 |
| b | 1 |
| r | 0 |
| c | 0 |
| d | 0 |

Output Stream: a b r a c a d a b
Code Stream: 1 2 0 3 1 2 5
Literal Stream:

FIG. 7K

| Symbol | Count |
|---|---|
| <Esc> | 5 |
| a | 3 |
| b | 1 |
| r | 0 |
| c | 0 |
| d | 0 |

Output Stream: a b r a c a d a b r
Code Stream: 2 0 3 1 2 5
Literal Stream:

FIG. 7L

| Symbol | Count |
|---|---|
| <Esc> | 5 |
| a | 4 |
| b | 1 |
| r | 1 |
| c | 0 |
| d | 0 |

Output Stream: a b r a c a d a b r a
Code Stream: 0 3 1 2 5
Literal Stream:

| Symbol | Count |
|---|---|
| <Esc> | 5 |
| a | 5 |
| b | 1 |
| r | 1 |
| c | 0 |
| d | 0 |

Output Stream: a b r a c a d a b r a a

Code Stream: 3 1 2 5

Literal Stream:

FIG. 7M

| Symbol | Count |
|---|---|
| <Esc> | 5 |
| a | 5 |
| b | 2 |
| r | 1 |
| c | 0 |
| d | 0 |

Output Stream: a b r a c a d a b r a a b

Code Stream: 1 2 5

Literal Stream:

FIG. 7N

| Symbol | Count |
|---|---|
| <Esc> | 5 |
| a | 5 |
| b | 2 |
| r | 2 |
| c | 0 |
| d | 0 |

Output Stream: a b r a c a d a b r a a b r

Code Stream: 2 5

Literal Stream:

Output Stream: a b r a c a d a b r a a b r a

Code Stream: 5

Literal Stream: (empty)

| Symbol | Count |
|--------|-------|
| a | 6 |
| <Esc> | 5 |
| b | 2 |
| r | 2 |
| c | 0 |
| d | 0 |

FIG. 7Q

Output Stream: a b r a c a d a b r a a b r a c

Code Stream: (empty)

Literal Stream: (empty)

| Symbol | Count |
|--------|-------|
| a | 6 |
| <Esc> | 5 |
| b | 2 |
| r | 2 |
| c | 1 |
| d | 0 |

DIFFERENCE CODING ADAPTIVE CONTEXT MODEL USING COUNTING

TECHNICAL FIELD

The present invention relates generally to data coding. More particularly, this invention relates to difference coding adaptive context model using counting used in data coding.

BACKGROUND

Traditional entropy encoding coding algorithms (such as Huffman coding, adaptive Huffman coding or range coding) can normally be improved by preprocessing their input using a technique designed to enhance the statistical features used by the compression algorithm to achieve coding efficiencies. One example of such a technique is the Burrows-Wheeler transform ("BWT"), where large blocks of input are rearranged in a sorted order. While BWT does improve compression efficiency, it does not replace symbol values, so it may not be as efficient on input streams with a wide variance in symbols, or streams where a large number of the symbols have high values. Thus, a technique to transform these input streams so that they may be efficiently compressed is needed.

BRIEF DESCRIPTION OF THE DRAWINGS

The present invention is illustrated by way of example and not limitation in the figures of the accompanying drawings in which like references indicate similar elements.

FIGS. 3-4 are data structures which may be used for encoding and decoding processes according to one embodiment of the invention.

FIGS. 6A-6Q are data diagrams illustrating an encoding process according to one embodiment of the invention.

FIGS. 7A-7Q are data diagrams illustrating a decoding process according to one embodiment of the invention.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
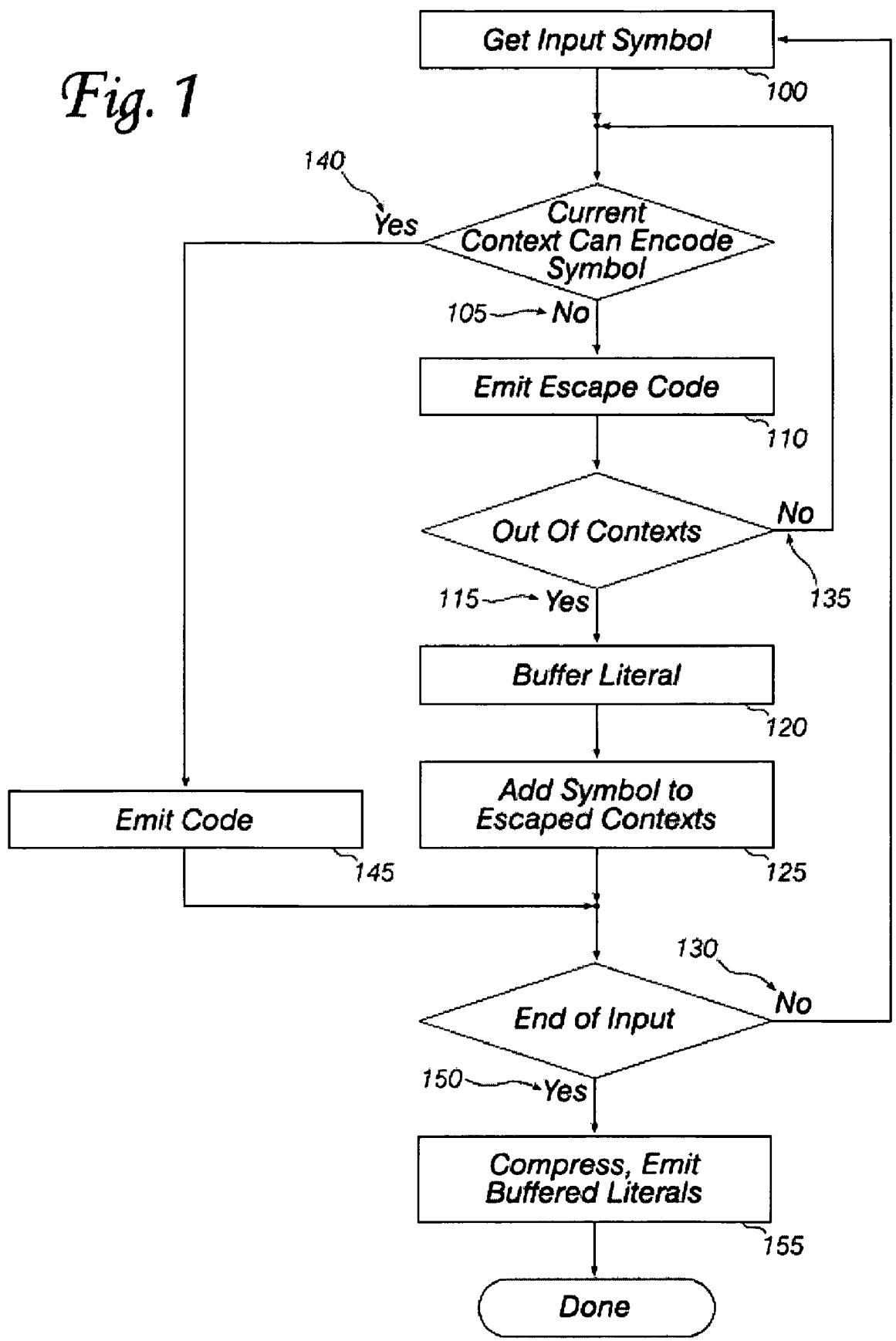
FIG. 1 shows an overview of an adaptive coding process according to an embodiment of the invention.
Figure 2:
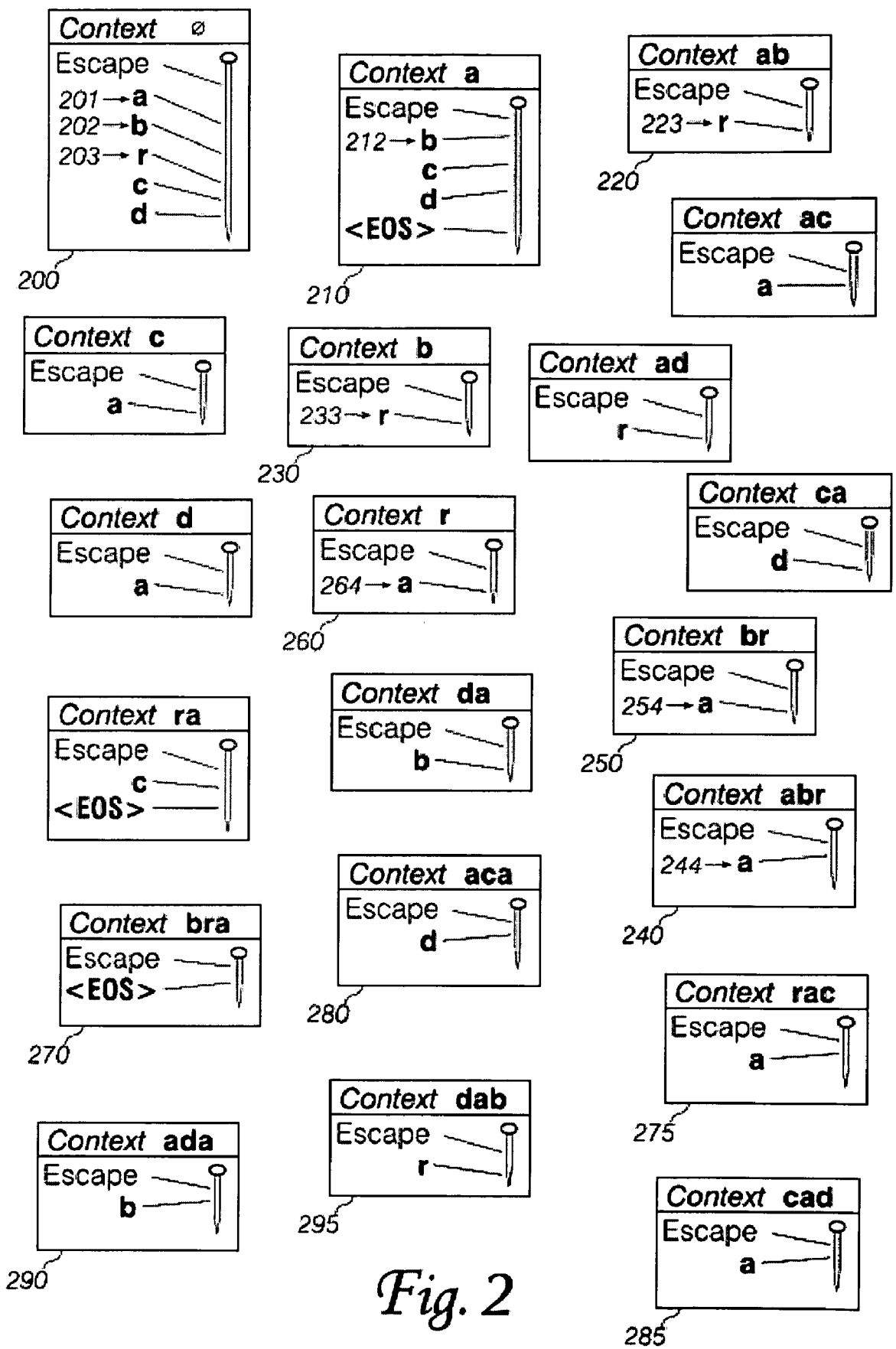
FIG. 2 shows the three-symbol contexts that are created as an embodiment of the invention compresses the string "abracadabra".

FIG. 1 is a flow diagram illustrating operations of an adaptive difference coder according to one embodiment of the invention. The following explanation will track the coder through the flow chart as it processes an input string, "abracadabra". Coding can be thought of as building a model of the input data and picking a minimal set of clues about the model to send to a decoder, so that the decoder can replicate the model and reproduce the input string. FIG. 2 shows "contexts" of the model according to certain embodiments of the invention. Each context corresponds to symbols the coder has recently encoded (or symbols the decoder has recently recovered). The coder examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

According to one embodiment, as an example of an implementation, each context may be defined as a data structure as shown in FIG. 3. Referring to FIG. 3, each context includes a parent pointer pointing to a parent context of the current context (e.g., a shorter context). The root context would have the parent pointer as NULL or zero since it does not have any parent. Each context may also include one or more child contexts (e.g., longer contexts or next order contexts), where number of the child contexts depends on a specific application or configuration. In this example, it is assumed that there are 256 different symbols plus an escape symbol. Note that the data structure as shown in FIG. 3 is described for purposes of illustration only. Other formats or configurations may also exist.

Although all of the contexts, and the symbols each can encode, are shown in FIG. 2, they accumulate over time (as described below). The model starts out empty, with the initial context 200 (e.g., context " " as a root context) able to encode only an escape symbol. The escape symbol is distinct from the 256 possible symbols that could be present in a stream of eight-bit characters.

The coder retrieves the first input symbol (block 100), a. The current context, 200, cannot (yet) encode a (block 105) so the coder emits an escape token (block 110) and moves to a shorter context. Since context 200 is the shortest (zero-character) context, the coder is out of contexts (block 115). It buffers the literal a (120) and adds a to each of the escaped contexts (block 125). (Element 201 indicates the a added to context 200.) The coder has not reached the end of its input (block 130), so it loops back to get the next input symbol (block 100).

Figure 4:
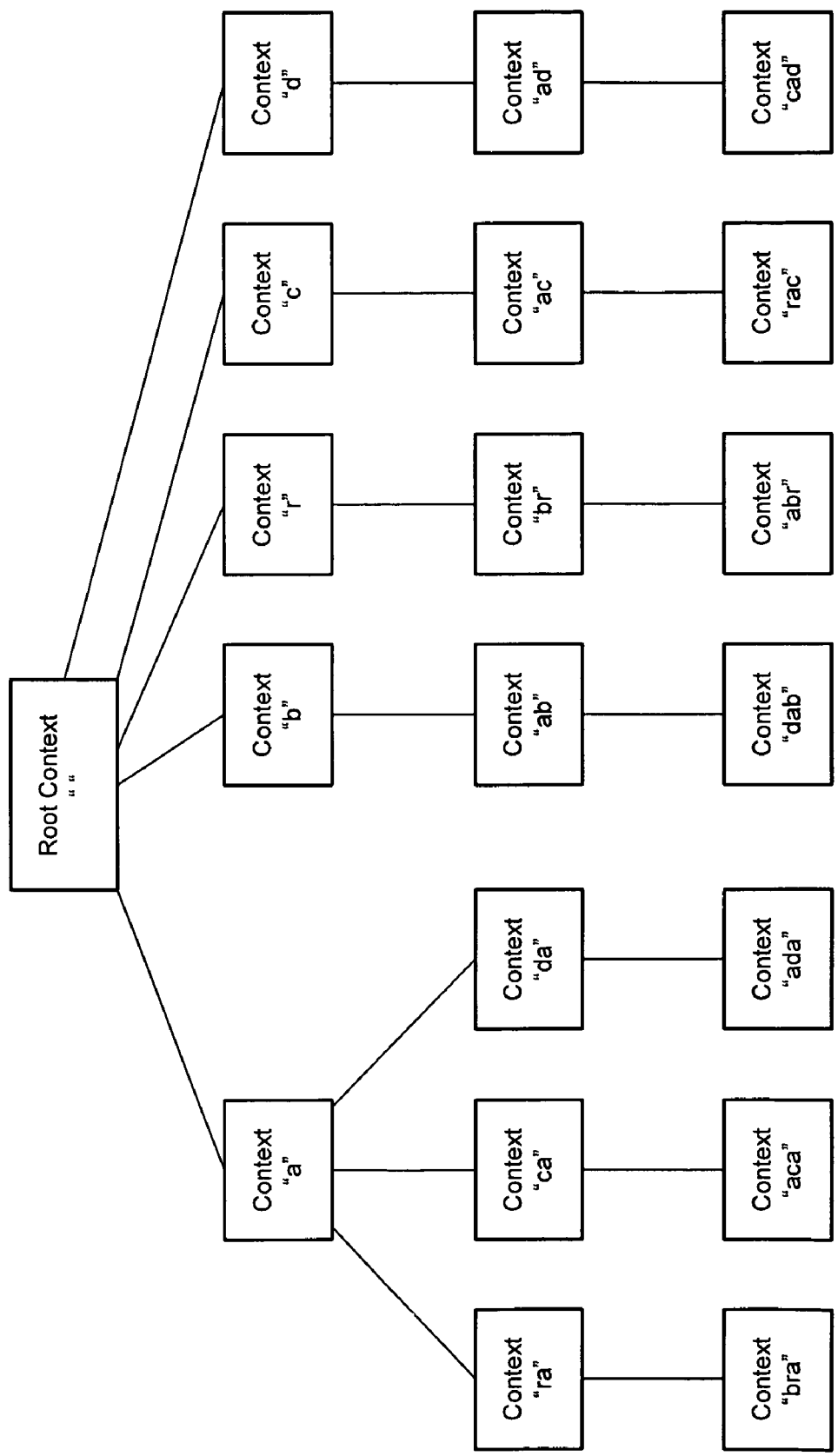

In practice, a child context is created having a parent pointer pointing to context 200 while context 200 has a child pointer pointing to the newly created child context, forming a tree structure similar to the one as shown in FIG. 4. In this example, context 210 (e.g., context "a") is created from context 200, where context "a" includes a parent pointer pointing to context 200 while context 200 includes a child pointer pointing to context "a", as shown in FIG. 4. At this point, context "a" can only encode an escape symbol, also referred to as "<Esc>" symbol, which may be considered implicit <Esc> symbol.

The next symbol is b, and the coder starts with the last context corresponding to the last symbol which is context "a"

(block 210). Since context 210 cannot (yet) encode b (block 105), the coder emits an escape token (block 110) and moves (e.g., escapes) to a shorter context, which is context 200 (e.g., the parent context of context "a") as shown in FIG. 4. The next-shortest context is 200, so the coder is not out of contexts (block 135) and loops back to consider context 200. Context 200 is also unable to encode b (block 105) (it can currently encode only escape and a), so the coder emits another escape token (block 110) and moves to a shorter context. Again, context 200 is the shortest context, so the coder is out of contexts (block 115). The literal, b, is buffered and also added to each escaped context (blocks 202, 212). So far, the coder has emitted three escapes and buffered two literals. Only the escape from context 200 on input symbol b required any bits to encode; all the other escapes were from contexts that could only encode the escape.

The next symbol is r and the starting context is ab (block 220), which corresponds to the last context with respect to "r" (e.g., for sequence of "abr" the last context having up to three symbols is context "ab"). Context 220 cannot encode r (block 105), so the coder emits an escape token (block 110) and moves to shorter context b (block 230) (e.g., parent context of context "b" as shown in FIG. 4). Context 230 also cannot encode r (block 105), so the coder emits another escape token (block 110) and moves to shorter context 200. Context 200 cannot encode r (block 105), so the coder emits another escape token (block 110) but is out of contexts (block 115), which in turns creates a child context "r", etc. Literal r is buffered and added to contexts 200, 220 and 230 (see 203, 223 and 233). The end of the input has still not been reached (block 130), so the coder loops back yet again.

For the next input symbol, a, the coder starts at context 240 and escapes through 240, 250 and 260 (adding coding 244, 254 and 264) before discovering that context 200 can encode the input symbol (block 140). Therefore, the coder emits the appropriate code (block 145) and loops back again.

The following table summarizes the activity of the coder working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the coder buffered a literal and updated one or more escaped-from contexts.

TABLE 1

| Symbol | Start Context | Escapes | Coding Context | Literal |
|---|---|---|---|---|
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream (EOS) literal, the coder determines that the end of input has been reached (block 150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

Figure 5:
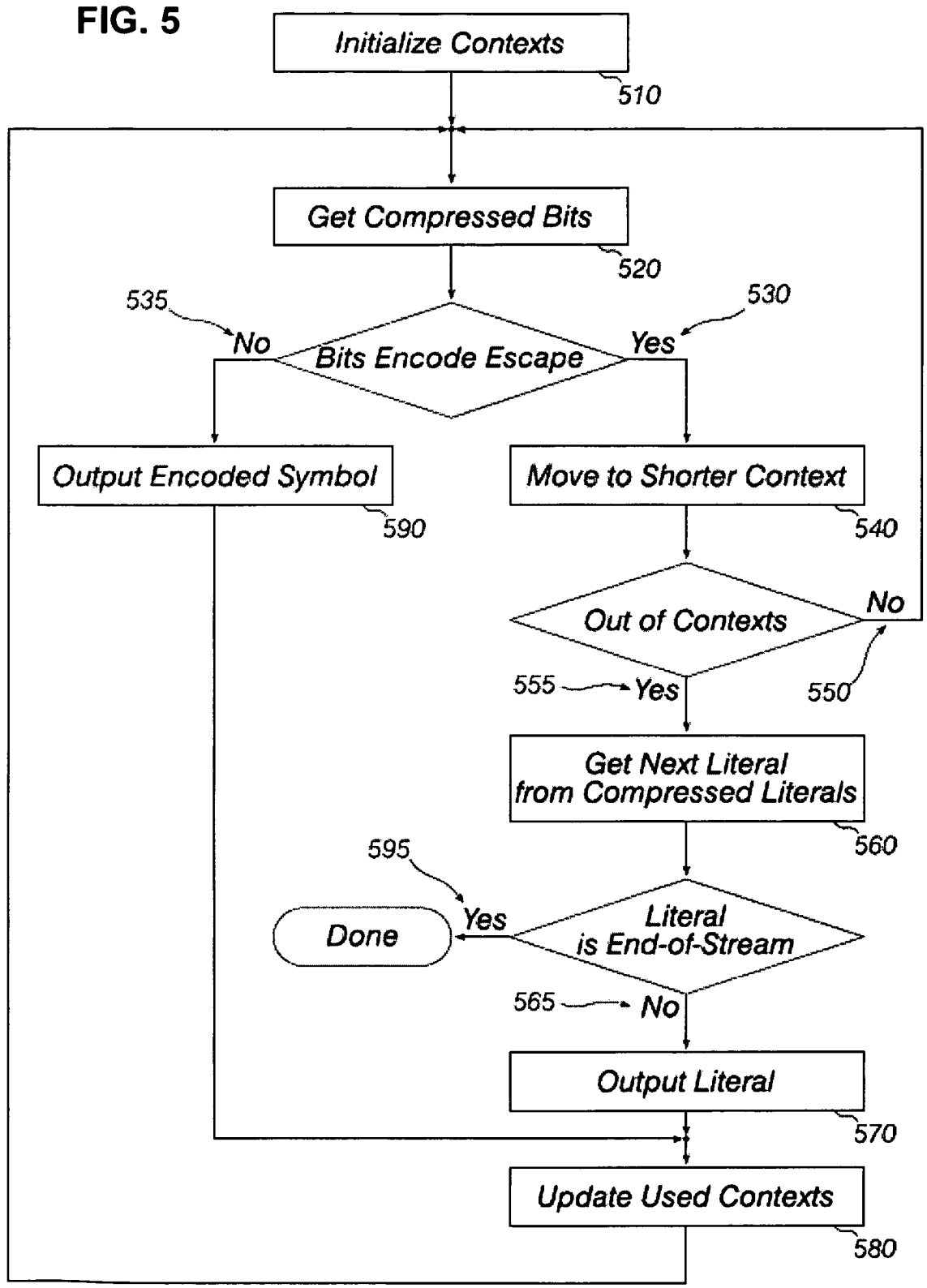
FIG. 5 is a flow diagram outlining decoding according to an embodiment of the invention.

FIG. 5 is a flow diagram outlining the operations of an adaptive data decoder according to an embodiment of the invention. Referring to FIG. 5, the decoder initializes its context model identically to the coder's initialized model (block 510). Recall that despite the large number of contexts (shown in FIG. 2) that exist after compressing an input stream, the coder and decoder start with just one context, 200, that can encode just one symbol, escape.

Next, the decoder gets some compressed bits from the compressed data stream. The number of compressed bits necessary to decide what to do next varies from time to time, depending on the state of the decoding context. For example, when decoding has just started and context 200 can only encode escape, no bits are required—the decoder knows that the coder must have emitted an escape, because that is the only thing it could emit. Consequently, the escape is encoded in zero bits.

Since the first compressed bits encode escape (block 530), the decoder moves to a shorter context (block 540). However, since context 200 is already the shortest context, the decoder is out of contexts (block 555) and requires a literal. It obtains the next literal from the literal decoder (block 560), checks to ensure that it has not reached the end-of-stream (block 565) and outputs the literal as the reconstituted data (block 570). Referring to Table 1, it is clear that the first compressed literal was a, so that symbol is output.

Any contexts used (e.g., escaped from) are updated (block 580), and the decoder loops back to get more compressed bits (block 520). (Again, no compressed bits have been used yet, because no existing context could encode anything except Escape.)

Now, the decoder is in context 210, because it has just produced the symbol a. Context 210 is unable to encode any symbol except escape, so the decoder again consumes zero bits to determine that the next encoded symbol is escape (block 530). Now, the decoder moves to the next-shorter context (block 540), which is context 200. It is not out of contexts (block 550), so it loops back to get more compressed bits (block 520).

Context 200 currently encodes escape and a, so some information (at least a portion of a compressed bit) is required to decide which. This compressed bit encodes another escape (block 530). This is the third escape mentioned above. The decoder moves to a shorter context (block 540) and runs out of contexts (555), so it gets the next literal from the compressed literals (block 560), notes that it is not end-of-stream (block 565), and outputs it (block 570). Recall that the second literal produced during coding was b. The contexts escaped from (210, 200) are updated (block 580) and the decoder loops back again.

This process continues until the characters abr have been recovered and output. The decoder is in state 240 and gets some more compressed bits (block 520). States 240, 250 and 260 only encode escapes, so no bits are consumed as the decoder escapes to shorter contexts. When it reaches context 240, it discovers that the next compressed bits encode a (block 535), so it outputs this symbol (block 590), updates the appropriate contexts (580) and loops back to process more compressed bits.

The decoder continues working through the compressed bits, extracting literals as necessary from the compressed literals block, until there are no more compressed bits to examine. At this point, the original input symbol sequence has been reconstituted and emitted.

Note that the decoding process requires literals from the compressed block fairly early in its operations (in fact, the very first thing it does is infer an escape from zero compressed bits, extract a compressed literal and output it). Thus, it is important for the decoder to have access to the compressed literals as soon as possible. If the decoder has access to the entire compressed data stream, then it can use the dual-file-pointer method depicted to access the literals as necessary. However, if the decoder is receiving the compressed data stream from a non-seekable source, it must buffer the data until it can determine where the compressed literals are. Further detailed information regarding the techniques set forth above can be found in a co-pending U.S. patent application Ser. No. 11/948,954, filed Nov. 30, 2007, which is incorporated by reference herein.

According to certain embodiments of the invention, the above data coding techniques may be further improved by optimizing context tables, such as, for example, by counting a number of symbols being emitted, moving the highest frequency occurred symbol up front in the table, and using the index corresponding symbols to be coded in a code stream in order to further optimize encoding and decoding processes while maintaining the size of the data stream as minimum.

According to one embodiment, the basic idea is to reorder the context tables used by an adaptive context model so that the most probable bytes values have low code numbers. For this case, the reordering is done by counting the incidence of each byte value in each particular context. Move to front coding takes better advantage of strong temporary locality of reference artifacts, and may be best suited to input that's been preprocessed with a Burroughs-Wheeler block sort transform. Ordering by probability probably has better global properties. The code values that are emitted from the context model would then be difference coded—the value of each succeeding code is represented as its difference from the previous code. If the XOR operator is used in place of integer subtraction, we can avoid having to deal with potential overflow. If the context model is accurate, it will generate a stream of mostly small code values, which will lead to a stream of very small differences. The output differences could then be easily compressed using a compression pass that's optimized for mostly small values in a narrow range.

Figure 8A:
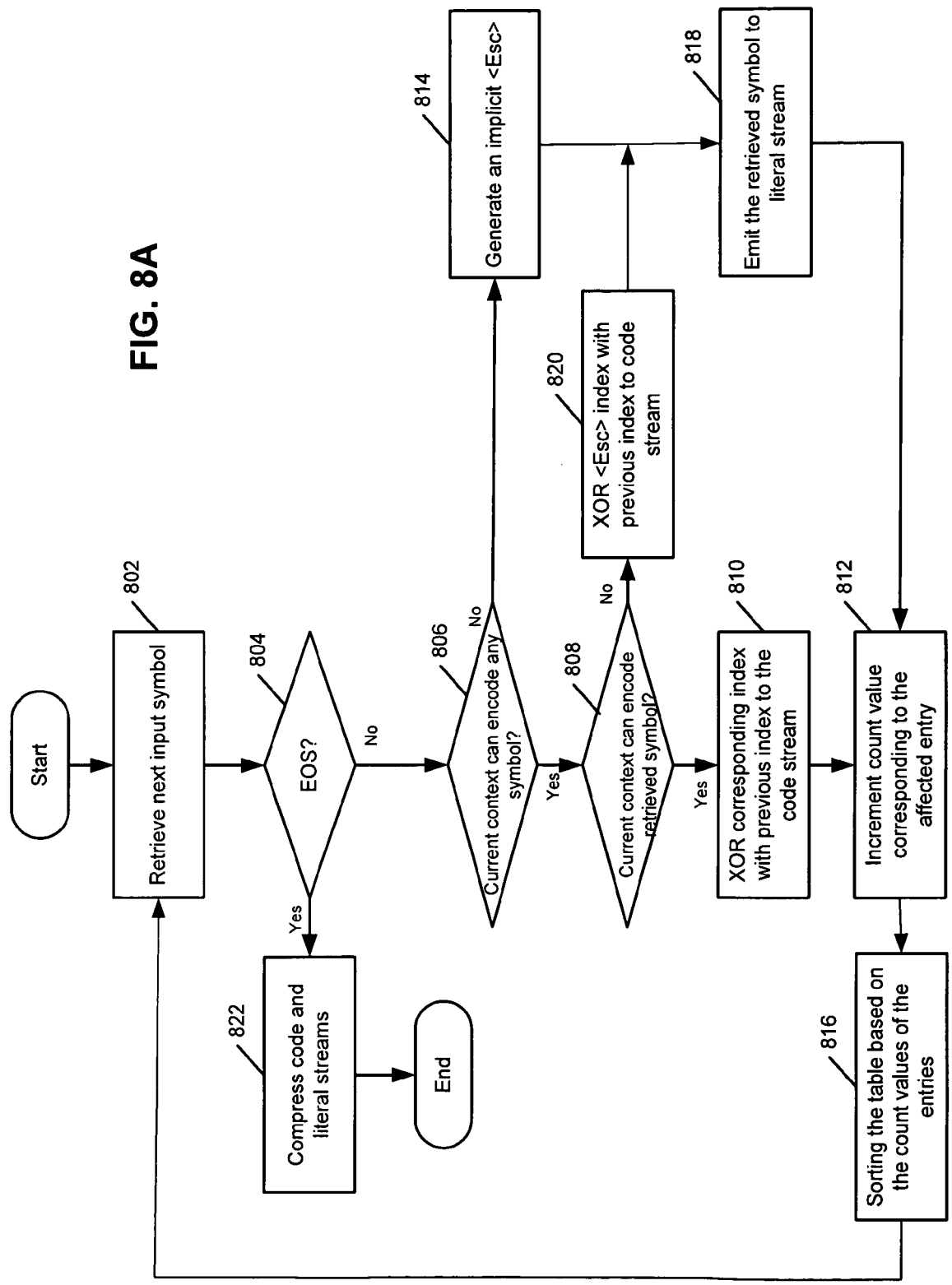
FIGS. 8A-8B are flow diagrams illustrating examples of encoding and decoding processes according to certain embodiments of the invention.

FIGS. 6A-6Q are diagrams illustrating an encoding process using counting according to one embodiment of the invention. In this example, a single context model is utilized using the sequence of "abracadabraabrac"; however, multiple context tables may also be utilized similar to those described above. A flow operation associated with FIGS. 6A-6Q is shown in FIG. 8A. A context table may be implemented using a data structure similar to the one shown in FIG. 3.

Referring to FIGS. 6A-6Q and 8A, an encoder (also referred to as simply a coder) starts with an empty context table as a root table as shown in FIG. 6A. At the first "a" as a next symbol from an input stream (block 802), since symbol "a" is not an end-of-stream (EOS) symbol (block 804) and the current context cannot encode anything other than an escape token, also referred to as <Esc> (block 806), the coder implicitly generates (but does not add to the code stream) an escape token (block 814), and adds the letter "a" to the literals stream (block 818) as shown in FIG. 6B.

Note that "a" has a count of 0, since it was not actually coded (it could be entered as 1 without affecting the codes that are generated, as long as the escape code also starts with a count of 1). In addition, the count value corresponding to the escape token is incremented and the context table is sorted to move the most frequent entry (in this example the <Esc> entry) up front at index zero (blocks 812-816).

The next letter is the "b" here (e.g., "a*b*racadabraabrac") and it is not an EOS (blocks 802-804). Since the current context can encode something other than an escape (e.g., symbol "a") but cannot encode symbol "b" (blocks 806-808), the coder needs to explicitly emit an <Esc>. At this point as shown in FIG. 6B, the escape code's index is zero, so the code will be zero (e.g., code of 0=index 0 XORed with previous index of 0) and the generated code of 0 is emitted to the code stream at block 820. The symbol "b" is emitted into the literal stream at block 818. The code stream is now "0", and the literals stream is now "ab". In addition, the count of <Esc> entry is incremented and the context table is sorted (blocks 812 and 816) as shown in FIG. 6C.

Now, the coder comes to the "r" (e.g., "ab*r*acadabraabrac") and it is not an EOS (blocks 802-804). Again, since the current context can encode something but not symbol "r", an escape is generated which generates code of 0 (e.g., code of 0=index 0 XORed with previous index of 0), and the "r" is appended to the table (blocks 820, 818). In addition, the count of <Esc> entry is incremented and the table is sorted (blocks 812 and 816). The code stream is now "0, 0", and the literals stream is "abr" as shown in FIG. 6D.

At this point, the coder is coding the "a" (e.g., "abr*a*cadabraabrac") and it is not an EOS (blocks 802-804). This time, the symbol "a" is in the table and thus, the current context can in fact encode symbol "a". So the coder adds just the code to the code (1=index of 1 XORed with previous index of 0) and updates the table (blocks 808 and 810). In addition, the entry corresponding to symbol "a" is incremented and the table is sorted accordingly (blocks 812 and 816). However, since the count value of <Esc> entry is greater than the count value of "a" entry, the <Esc> entry remains on top at index zero. The code stream is now "0, 0, 1", and the literals stream is still "abr" as shown in FIG. 6E.

Now, back at block 802, the encoder is about to code symbol "c" (e.g., "abra*c*adabraabrac"). Again, since the current context can encode something but not symbol "c", the coder generates an escape (code 1=index of 0 XORed with previous index of 1), updates the table, and buffers the literal (blocks 806, 808, 820, and 818). In addition, the count value of <Esc> entry is incremented and the table is sorted (blocks 812 and 816). The code stream is now "0, 0, 1, 1", and the literals stream is "abrc" as shown in FIG. 6F.

Now back at block 802, the coder is coding the "a" (e.g., "abrac*a*dabraabrac"). Since the current context can encode symbol "a", the coder will generate a code. At this point, symbol "a" is at offset 1 which generates code 1 (index of 1 XOR previous index of 0) at blocks 808 and 810. In addition, the count of symbol "a" is incremented and the table is sorted at blocks 812 and 816). The code stream is now "0, 0, 1, 1, 1", and the literals stream is still "abrc" as shown in FIG. 6G.

Next literal is "d" (e.g., "abraca*d*abraabrac") at block 802. Since the current context can encode something but not symbol "d", the coder generates and codes an escape (code 1 index of 0 XORed with previous index of 1) and adds symbol "d" to the literals stream (blocks 806, 808, 820, and 818). In addition, the count of <Esc> entry is incremented and the table is sorted (blocks 812 and 816). The code stream is now "0, 0, 1, 1, 1, 1", and the literals stream is now "abrcd" as shown in FIG. 6H.

The coder now comes to the second to last "a" (e.g., "abracad*a*braabrac") at block 802. Since the current context can encode symbol "a", the code for "a" is 1 (index 1 XORed with previous index of 0) at block 810. In addition, the count for "a" entry in the table is incremented and the table is sorted (blocks 812 and 816). The code stream is now "0, 0, 1, 1, 1, 1, 1", and the literals stream is "abrcd" as shown in FIG. 6I.

For next symbol "b" (e.g., "abracada*b*raabrac") at block 802, the code for "b" is 3 (index of 2 XOR previous index of 1) at blocks 806, 808, and 810. In addition, the entry for "b" would be incremented and the table is sorted (blocks 812 and 816). The code stream is now "0, 0, 1, 1, 1, 1, 1, 3". The literals stream is "abrcd" as shown in FIG. 6J.

Continuing, the "r" would be coded as 1 (index of 3, XOR previous index of 2) and the count for "r" entry is incremented and the table is sorted as shown in FIG. 6K. Similarly, for symbol "a" would code as 2 (index of 1 XOR previous index of 3) and its count is incremented as shown in FIG. 6L.

Figures 6M, 6N, 6O:
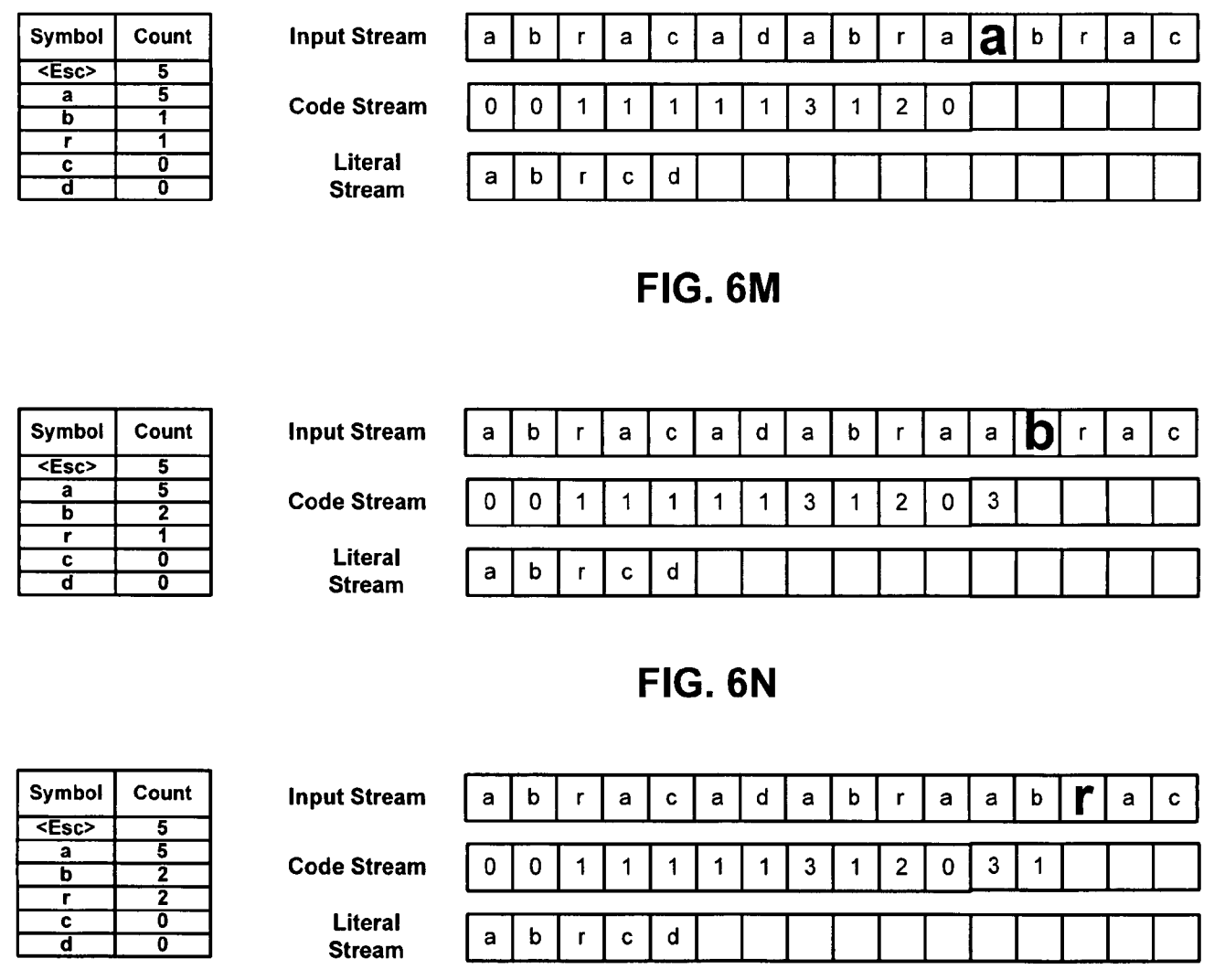

In this example, there is no need to reorder the table. For a more complex example, such as "abracadabraabrac", we continue where we left off at this "a" (e.g., "abracadabra*a*brac"). The index of 1 in this case would lead to a code of 0. The next three letters "bra" would be coded as 3, 1, and 2, as shown in FIGS. 6M-6O). However, after coding the "a", the table would get reordered as shown in FIG. 6P.

Now the coder is looking at the last symbol "c" (e.g., "abracadabraabra*c*"). This has an index of 4, and a code of 5 as shown in FIG. 6Q. As can be seen, the frequency counting table has somewhat higher variance. The variance could be lowered a little by never incrementing the escape frequency count and entering each symbol with a count of one (at which point the escape would move past every byte that is appeared more than once in the input).

Figures 7A, 7B, 7C:
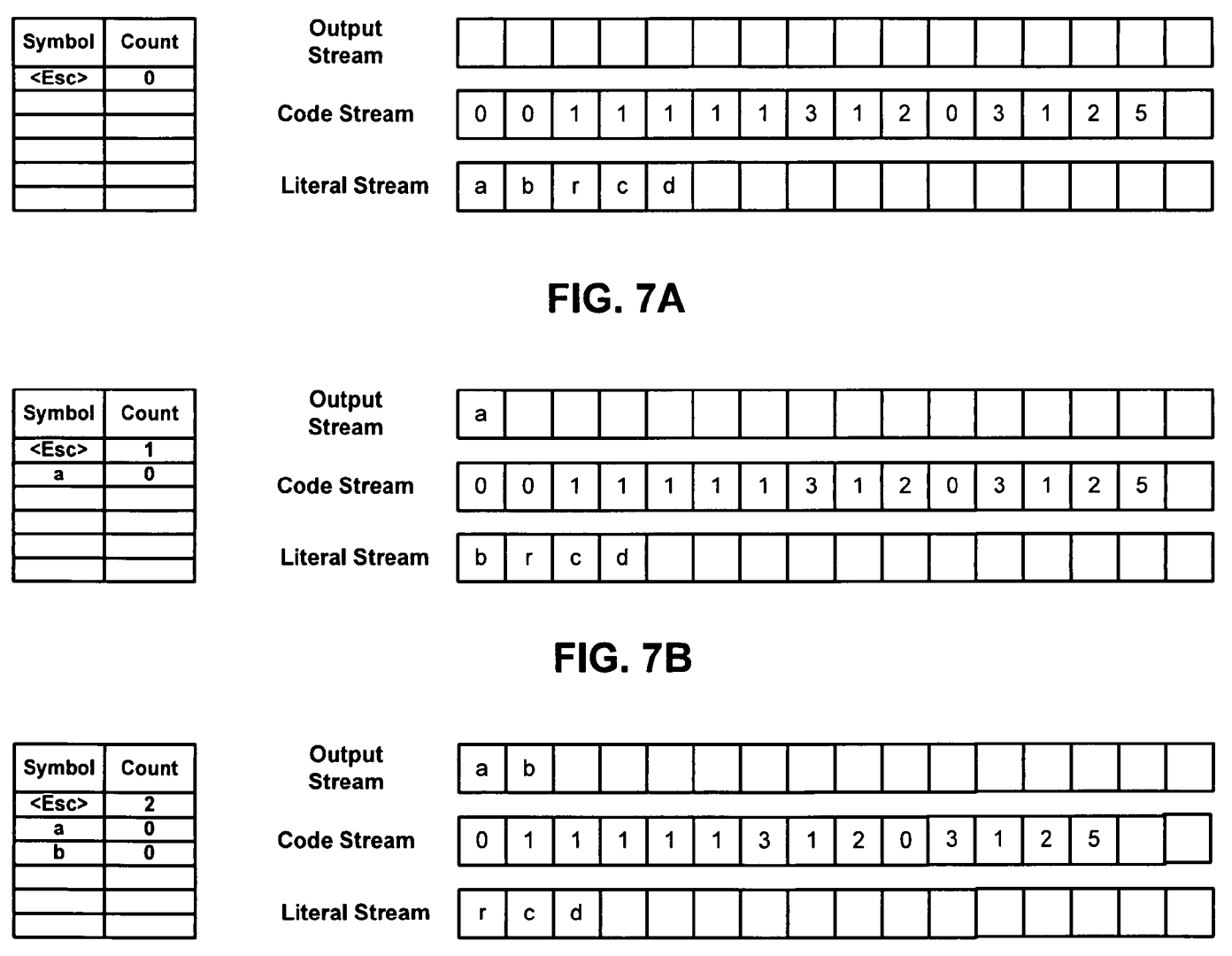
Figure 8B:
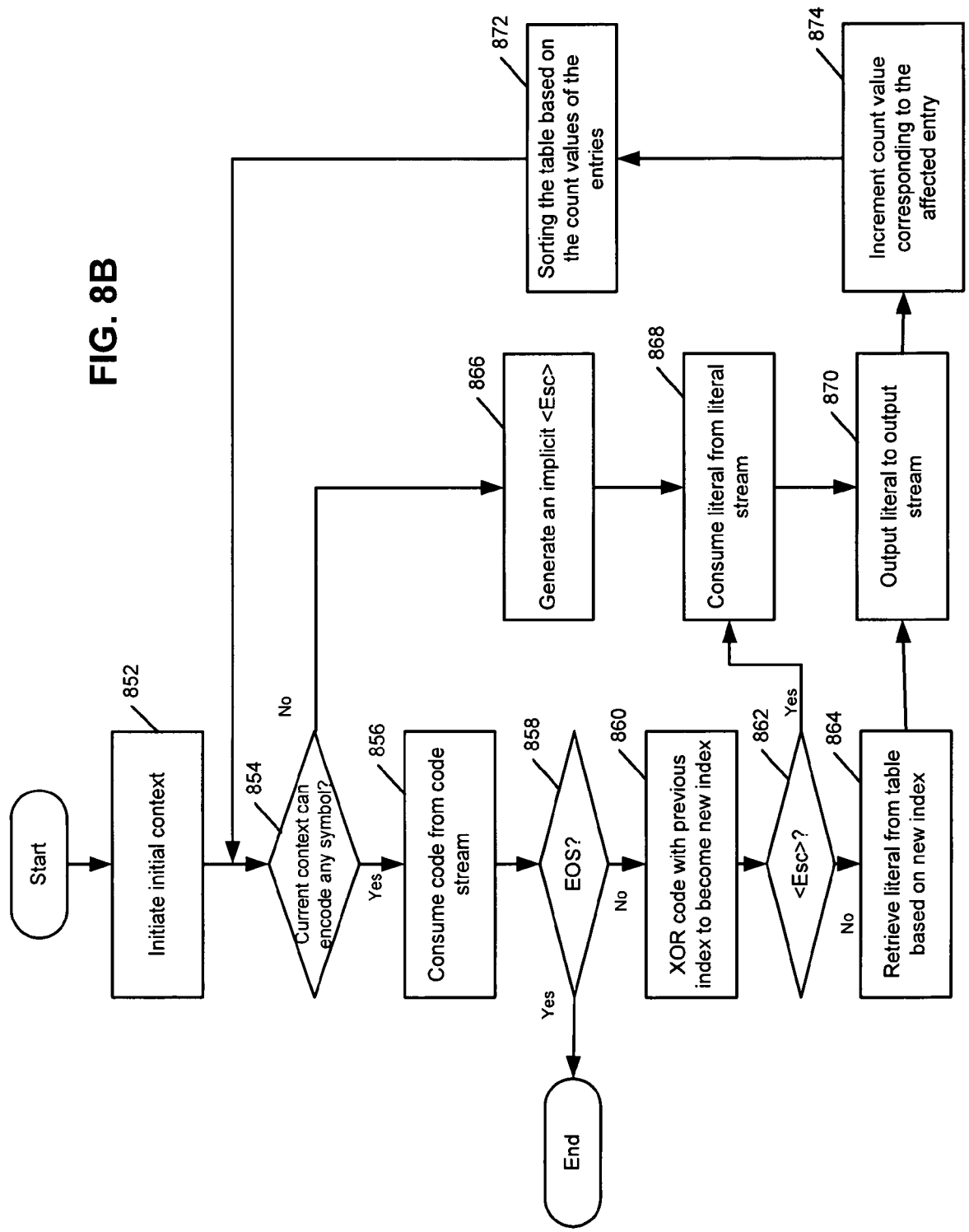

FIGS. 7A-7Q are diagrams illustrating a decoding process using counting according to one embodiment of the invention. In this example, a single context model is utilized to decode the code stream and literal stream generated by FIGS. 6A-6Q and 8A; however, multiple context tables may also be utilized similar to those described above. A flow operation associated with FIGS. 7A-7Q is shown in FIG. 8B. A context table may be implemented using a data structure similar to the one shown in FIG. 3.

Referring to FIGS. 7A-7Q and 8B, at the beginning as shown in FIG. 7A, for the purpose of illustration, the context table starts as an empty table and an empty output stream (block 852). Input streams include a code stream having a code sequence of "001111131203125" and a literal stream having a sequence of "abrcd", which are generated from the encoding process of FIGS. 6A-6Q and 8A.

At block 854, since the current context cannot code anything other than an escape token <Esc>, an implicit <Esc> is generated at block 866 and a next literal of "a" is consumed from the literal stream at block 868. The consumed literal is emitted to the output stream at block 870. In addition, a new entry for symbol "a" is added to the context table with an initial count value of zero and the count of <Esc> is incremented at block 874. Further, the table is sorted based on the count value at block 872. In this example, the entry of <Esc> is positioned on the top at index zero since it has the highest count value, as shown in FIG. 7B.

The process loops back at block 854 and since the current context now can code something other than an <Esc>, a next code of "0" is consumed from the code stream at block 856. Since it is not an EOS (block 858), the consumed code of 0 is XORed with a previous index of 0, which generates a new index of 0 (block 860). If the entry for the new index is an <Esc> (block 862), a next literal of "b" is consumed from the literal stream and added to the table with an initial count value of zero (block 868) and output to the output stream (block 870). In addition, the count value for <Esc> is incremented and the table is sorted (blocks 872-874), as shown in FIG. 7C.

Now back at block 854, since the current context can code something other than an <Esc>, a next code of 0 is consumed from the code stream (block 856) and XORed with a previous index of 0, which generates a new index of 0 (block 860). Since the new index of 0 corresponds to an <Esc> in the table, a next literal of "r" is consumed from the literal stream and added to the table with an initial count value of zero (block 868). The consumed literal is output to the output stream (block 870). In addition, the count value of <Esc> entry is incremented and the table is sorted accordingly (blocks 872-874), as shown in FIG. 7D.

Back at block 856, a next code of 1 is consumed from the code stream and XORed with a previous index of 0 (block 860), which generates a new index of 1. Since the entry corresponding to index 1 is "a", symbol "a" is output to the output stream (blocks 864 and 870). In addition, the count value of the "a" entry is incremented and the table is sorted accordingly (blocks 872-874). Since the count value for the <Esc> entry is still greater than the count value in the "a" entry, the <Esc> entry remains on the top at index zero, as shown in FIG. 7E.

Operations similar to the above processes are repeated for processing the subsequent code sequence of "1111312031" to recover the subsequent symbol sequence of "cadabraabr" as shown in FIGS. 7F-7O.

At this point referring to FIG. 7O, the next code of "2" is consumed from the code stream and XORed with the previous index of 3, which generates a new index of 1 (blocks 856 and 860). The entry corresponding to the new index of 1 is the "a" entry. As a result, symbol "a" is retrieved from the table and output to the output stream (blocks 864 and 870). In addition, the count value of the "a" entry is incremented (which is 6 now) at block 874. The table is sorted which moves the "a" entry over the <Esc> entry since the "a" entry's count value is now greater than the <Esc> entry's (block 872), as shown in FIG. 7P.

The last code from the code stream is 5 and XORed with a previous index of 1, which generates a new index of 4. The entry corresponding to index of 4 is symbol "c" in the table. Thus, symbol "c" is output to the output stream, as shown in FIG. 7Q.

Note that the operations described above may be performed by an encoder and/or a decoder, which may be implemented in software, hardware, or a combination of both.

Figure 9:
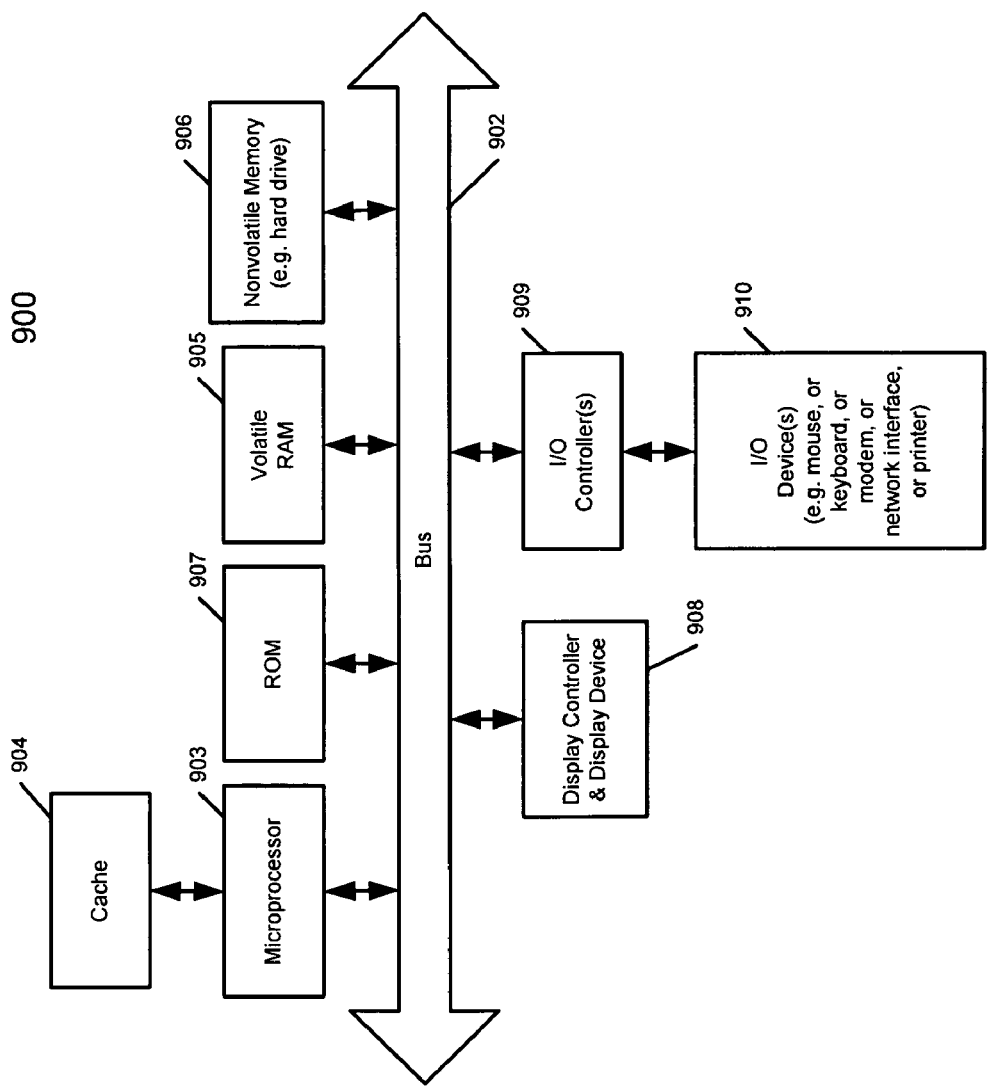
FIG. 9 is a block diagram illustrating an example of a data process system which may be used with one embodiment of the invention.

FIG. 9 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 1300 may be used as part of system, either an coder or a decoder, to perform the coding processes set forth above.

As shown in FIG. 9, the system 900, which is a form of a data processing system, includes a bus or interconnect 902 which is coupled to one or more microprocessors 903 and a ROM 907, a volatile RAM 905, and a non-volatile memory 906. The microprocessor 903 is coupled to cache memory 904 as shown in the example of FIG. 9. Processor 903 may be, for example, a PowerPC microprocessor or an Intel compatible processor. Alternatively, processor 903 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 902 interconnects these various components together and also interconnects these components 903, 907, 905, and 906 to a display controller and display device 908, as well as to input/output (I/O) devices 910, which may be mice, keyboards, modems, network interfaces, printers, and other devices which are well-known in the art.

Typically, the input/output devices 910 are coupled to the system through input/output controllers 909. The volatile RAM 905 is typically implemented as dynamic RAM (DRAM) which requires power continuously in order to refresh or maintain the data in the memory. The non-volatile memory 906 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 9 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 902 may include one or more buses connected to each other through various bridges, controllers, and/or adapters, as is well-known in the art. In one embodiment, the I/O controller 909 includes a USB (Universal Serial Bus) adapter for controlling USB peripherals. Alternatively, I/O controller 909 may include an IEEE-1194 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for encoding data, the method comprising:

in response to a symbol retrieved from an input stream having a sequence of symbols, determining whether a current context can encode the retrieved symbol, wherein the current context includes a plurality entries, wherein each entry represents a symbol that the current context is able to encode, including a count value representing a frequency of each entry being used, wherein each symbol in the current context is listed in a literal stream;

generating a code to be emitted to a code stream, the code representing a difference between an index of an entry in the current context associated with the retrieved symbol and a previous index used for encoding a previous symbol, if the current context can encode the retrieved symbol;

incrementing a count value corresponding to the entry associated with the retrieved symbol in the current context; and sorting at least a portion of the current context based on count values of all entries in the current context, wherein the code stream and the literal stream are to be compressed and encoded by a compressor.

2. The method of claim 1, further comprising:
emitting the retrieved symbol to the literal stream if the current context cannot encode the literal stream; and
adding the retrieved symbol to the current context with an initial count value of zero.

3. The method of claim 2, wherein the code is generated based on an index associated with an escape token of the current context if the current context cannot encode the retrieved symbol.

4. The method of claim 3, wherein if the current context cannot encode anything other than an escape token, the code generated based on an index associated with an escape token is implicitly generated without emitting the code to the code stream.

5. The method of claim 1, wherein the code is generated by an exclusive OR (XOR) operation between an index of the entry in the current context associated with the retrieved symbol and the previous index used for encoding the previous symbol.

6. The method of claim 1, wherein sorting the current context comprises moving an entry having a highest count value up front at index zero.

7. A computer readable medium including instructions that, when executed by a processing system, cause the processing system to perform a method for encoding data, the method comprising:
in response to a symbol retrieved from an input stream having a sequence of symbols, determining whether a current context can encode the retrieved symbol, wherein the current context includes a plurality entries, wherein each entry represents a symbol that the current context is able to encode, including a count value representing a frequency of each entry being used, wherein each symbol in the current context is listed in a literal stream;
generating a code to be emitted to a code stream, the code representing a difference between an index of an entry in the current context associated with the retrieved symbol and a previous index used for encoding a previous symbol, if the current context can encode the retrieved symbol;
incrementing a count value corresponding to the entry associated with the retrieved symbol in the current context; and
sorting at least a portion of the current context based on count values of all entries in the current context, wherein the code stream and the literal stream are to be compressed and encoded by a compressor.

8. The computer readable medium of claim 7, wherein the method further comprises:
emitting the retrieved symbol to the literal stream if the current context cannot encode the literal stream; and
adding the retrieved symbol to the current context with an initial count value of zero.

9. The computer readable medium of claim 8, wherein the code is generated based on an index associated with an escape token of the current context if the current context cannot encode the retrieved symbol.

10. The computer readable medium of claim 9, wherein if the current context cannot encode anything other than an escape token, the code generated based on an index associated with an escape token is implicitly generated without emitting the code to the code stream.

11. The computer readable medium of claim 7, wherein the code is generated by an exclusive OR (XOR) operation between an index of the entry in the current context associated with the retrieved symbol and the previous index used for encoding the previous symbol.

12. The computer readable medium of claim 7, wherein sorting the current context comprises moving an entry having a highest count value up front at index zero.

13. A computer implemented method for decoding data, the method comprising:
in response to a code stream having a plurality codes and a literal stream having a plurality of symbols encoded by an encoder, consuming a code from the code stream if the current context can code any symbol other than an escape token;
generating an index value based on the consumed code, the index value representing a difference between the consumed code and a previous index used for decoding a previous symbol;
retrieving a symbol from an entry corresponding to the index value of the current context and emitting the retrieved symbol to the output stream; and
incrementing a count value associated with the entry corresponding to the index value, wherein each entry in the current context includes a count value representing a frequency of each entry being used; and
sorting the current context based on a count value of each entry in the current context.

14. The method of claim 13, further comprising:
consuming a literal from the literal stream and emitting the consumed literal to the output stream, if the index value represents an entry having an escape token in the current context; and
incrementing a count value associated with an entry having an escape token in the current context.

15. The method of claim 13, further comprising:
consuming a literal from the literal stream and emitting the consumed literal to the output stream, if the current context cannot code anything other than an escape token; and
incrementing a count value associated with an entry having an escape token in the current context.

16. The method of claim 13, wherein generating an index value based on the consumed code comprises performing an exclusive OR (XOR) the consumed code with the previous index used for decoding the previous symbol.

17. The method of claim 13, wherein sorting the current context comprises moving an entry having a highest count value up front at index zero.

18. A computer readable medium including instructions that, when executed by a processing system, cause the processing system to perform a method for decoding data, the method comprising:
in response to a code stream having a plurality codes and a literal stream having a plurality of symbols encoded by an encoder, consuming a code from the code stream if the current context can code any symbol other than an escape token;
generating an index value based on the consumed code, the index value representing a difference between the consumed code and a previous index used for decoding a previous symbol;
retrieving a symbol from an entry corresponding to the index value of the current context and emitting the retrieved symbol to the output stream; and
incrementing a count value associated with the entry corresponding to the index value, wherein each entry in the current context includes a count value representing a frequency of each entry being used; and sorting the current context based on a count value of each entry in the current context.

19. The computer readable medium of claim 18, wherein the method further comprises:

consuming a literal from the literal stream and emitting the consumed literal to the output stream, if the index value represents an entry having an escape token in the current context; and incrementing a count value associated with an entry having an escape token in the current context.

20. The computer readable medium of claim 18, wherein the method further comprises:

consuming a literal from the literal stream and emitting the consumed literal to the output stream, if the current context cannot code anything other than an escape token; and incrementing a count value associated with an entry having an escape token in the current context.

21. The computer readable medium of claim 18, wherein generating an index value based on the consumed code comprises performing an exclusive OR (XOR) the consumed code with the previous index used for decoding the previous symbol.

22. The computer readable medium of claim 18, wherein sorting the current context comprises moving an entry having a highest count value up front at index zero.

* * * * *